United States Patent
Hsu et al.

(10) Patent No.: US 8,014,163 B2
(45) Date of Patent: Sep. 6, 2011

(54) PACKAGE MODULE FOR A MEMORY IC CHIP

(75) Inventors: Cheng-Ho Hsu, Miao-Li (TW); Kuei-Hua Liu, Miao-Li (TW)

(73) Assignee: Kun Yuan Technology Co., Ltd., Chu-Nan (TW)

( * ) Notice: Subject to any disclaimer, the term of this patent is extended or adjusted under 35 U.S.C. 154(b) by 391 days.

(21) Appl. No.: 12/385,637

(22) Filed: Apr. 15, 2009

(65) Prior Publication Data

US 2010/0149758 A1 Jun. 17, 2010

(30) Foreign Application Priority Data

Dec. 12, 2008 (TW) .............................. 97222282 U

(51) Int. Cl.
*H05K 5/00* (2006.01)
(52) U.S. Cl. ..................................................... 361/760
(58) Field of Classification Search .................. 361/760, 361/729, 776, 772; 257/777, 685–686, 724; 438/108–109, 666
See application file for complete search history.

(56) References Cited

U.S. PATENT DOCUMENTS

| | | | | |
|---|---|---|---|---|
| 7,485,490 B2* | 2/2009 | Oh et al. | ....................... | 438/106 |
| 7,674,652 B2* | 3/2010 | Farnworth et al. | ............ | 438/107 |
| 7,675,180 B1* | 3/2010 | St. Amand et al. | ........... | 257/777 |
| 7,883,993 B2* | 2/2011 | Fuergut et al. | ................ | 438/464 |
| 7,889,513 B2* | 2/2011 | Shimanuki | ..................... | 361/776 |
| 2003/0012006 A1* | 1/2003 | Silverman | ...................... | 361/760 |
| 2006/0225918 A1* | 10/2006 | Chinda et al. | ................. | 174/260 |
| 2007/0177365 A1* | 8/2007 | Keith et al. | .................... | 361/760 |
| 2008/0212297 A1* | 9/2008 | Ni et al. | ......................... | 361/760 |
| 2008/0285244 A1* | 11/2008 | Knickerbocker | ............. | 361/760 |

* cited by examiner

*Primary Examiner* — Jean Duverne
(74) *Attorney, Agent, or Firm* — Bacon & Thomas, PLLC

(57) ABSTRACT

The present invention relates to a package module for a memory IC chip, in which first solder pads provided on an upper surface of the memory IC chip is electrically connected to lower contact pads provided on the periphery of the ground pad, lower contact pads is soldered upward with lead frames and upper contact pads, and lastly a molding layer is used for packaging and enclosing the above elements, while only exposing the lower contact pads and the upper contact pads. Therefore, it will facilitate that each of upper contact pads of a lower layer is correspondingly soldered to one of lower contact pads of an upper layer as the upper layer and the lower layer are stacked together. Thus, it is capable of obtain high acceptable production yield, while accomplishing the object of expanding the memory capacity in total when stacking the layers of the package structure.

10 Claims, 8 Drawing Sheets

PACKAGE MODULE FOR A MEMORY IC CHIP

BACKGROUND OF THE INVENTION

1. Field of the Invention

The present invention relates to a package module for a IC chip, and particularly to a package module for a memory IC chip.

2. Background of the Invention

Due to changing and development of science with each passing day, electronic products are developed to become lighter, shorter and smaller, and have exhibited significant progress for a computer, and communications and consumer electronic products used in the daily life.

Taking a mobile phone as an example, the current mobile phone not only is used for pure communications, but also provides multimedia functions, such as documentation, navigation, and video and voice entertainment, . . . etc. To elaborate powerful processing ability in a limited volume, it is a necessary trend to continuously raise memory capacity to store a lot of information.

FIG. 1 shows a cross-sectional view of a conventional memory IC chip set 9 in a stacking manner, in which a number of stacking internal chips 90 determine the magnitude of the chip capacity. As the number of stacking an internal chip 90 in the memory IC chip set 9 is getting more, the capacity of the chip set 9 is larger. On the contrary, as the number of stacking the internal chip 90 in the memory IC chip set 9 is getting fewer, the capacity of the chip set 9 is smaller. The size of the memory capacity is determined on the basis of the specification submitted by a customer, and a number of IC chips are stacked in a same package body 95 according to the specification so as to meet the customer's need.

In the embodiment shown in FIG. 1, the IC chip set 9 comprises a first chip 91, a second chip 92, a third chip 93 and a fourth chip 94, which are stacked together. Under the situation of requiring continuous increase of the capacity of the memory, the number of stacking chips in the internal chip 90 may reach 8 or even up to 12.

The stacking of the above-mentioned chips requires repetitively performing a number of procedures of putting the chips on and bonding. In performing the procedures, the more the number of stacking is, the higher the probability of occurring mistakes in bonding or of damaging the internal chip 90, rendering decrease of the production yield as a whole, thereby increasing the cost.

In addition, the capacity of the memory IC chip set 9 is fixed after packaging process and the capacity of the memory IC chip set 9 is limited due to packaging. As the customer submits requirements for different memory capacity, due to that the proceeding procedures of each memory with different capacity are different, the memory IC chip set 9, after completion of the production, cannot be flexibly combined or expanded according to the customer's requirements for different memory capacity, while in comparison, a module can be.

Therefore, it is desirable to provide an improved package module for a memory IC chip to mitigate and/or obviate the aforementioned problems.

SUMMARY OF THE INVENTION

The invention relates to a package module for a memory IC chip, including a ground pad, a plurality of lower contact pads, at least a first memory IC chip, a plurality of lead frames, a plurality of upper contact pads, and a molding layer. The plurality of lower contact pads are distributively provided on the periphery of the ground pad without electrically contacting one another. The at least a first memory IC chip is stacked on an upper side of the ground pad, an upper surface of the at least a first memory IC chip is provided with a plurality of first solder pads, and each of the plurality of first solder pads is electrically connected to one of the plurality of lower contact pads via one of a plurality of golden lines.

Each of the plurality of lead frames is correspondingly soldered to one of the plurality of lower contact pads. Each of the plurality of upper contact pads is correspondingly soldered to one of the plurality of lead frames. The molding layer is to package and enclose the ground pad, the plurality of lower contact pads, the at least a first memory IC chip, the plurality of lead frames and the plurality of upper contact pads, and curing the same, wherein a lower surface of the molding layer further exposes the plurality of lower contact pads and an upper surface of the molding layer further exposes the plurality of upper contact pads.

Since the upper contact pads are exposed to the upper surface of the molding layer and the lower contact pads are exposed to the lower surface of the molding layer, it will facilitate that each of a plurality of upper contact pads of a lower layer of a package structure is correspondingly soldered to one of a plurality of lower contact pads of an upper layer of a package structure as the layers of the package structure are stacked together. Thus, it is capable of obtaining a high acceptable production yield for each individual package module, while accomplishing the object of expanding the memory capacity as a whole when stacking the layers of the package structures. Moreover, the package module for a memory IC chip further comprises a covered package IC for covering an upper side of the molding layer, wherein a lower surface of the covered package IC is provided with a plurality of second solder pads, each being correspondingly soldered to one of the plurality of upper contact pads. The covered package IC comprises inside at least a package memory IC chip, wherein the covered package IC is selected from a no-lead package IC set constituted by a dual flat no-lead (DFN) package IC and a quad flat no-lead (QFN) package IC.

Still further, the package module for a memory IC chip is configured and installed on a circuit board, an upper surface of the circuit board is provided with a plurality of metal contacts, and each of the plurality of lower contact pads exposed on the lower surface of the molding layer is correspondingly soldered to one of the plurality of metal contacts.

The package module for a memory IC chip may comprise a package structure having at least two layers that are stacked together, wherein the package structure of each layer includes a ground pad, a plurality of lower contact pads, at least a first memory IC chip, a plurality of lead frames, a plurality of upper contact pads, and a molding layer, wherein each of the plurality of upper contact pads of a lower layer of the package structure is correspondingly soldered to one of the plurality of lower contact pads of an upper layer of the package structure.

Moreover, the package module for a memory IC chip further comprises a covered package IC for covering an upper side of the molding layer located on the uppermost layer of the package structure, wherein a lower surface of the covered package IC is provided with a plurality of second solder pads, each being correspondingly soldered to one of the plurality of upper contact pads located on the uppermost layer of the package structure. The covered package IC comprises inside at least a package memory IC chip and is selected from a no-lead package IC set constituted by a dual flat no-lead package IC and a quad flat no-lead package IC.

The package module for a memory IC chip is configured and installed on a circuit board, an upper surface of the circuit board is provided with a plurality of metal contacts, and each of the plurality of lower contact pads exposed on the lower surface of the molding layer located on the lowermost layer of the package structure is correspondingly soldered to one of the plurality of metal contacts in the circuit board.

Other objects, advantages, and novel features of the invention will become more apparent from the following detailed description when taken in conjunction with the accompanying drawings.

DETAILED DESCRIPTION OF THE INVENTION

Figure 1:
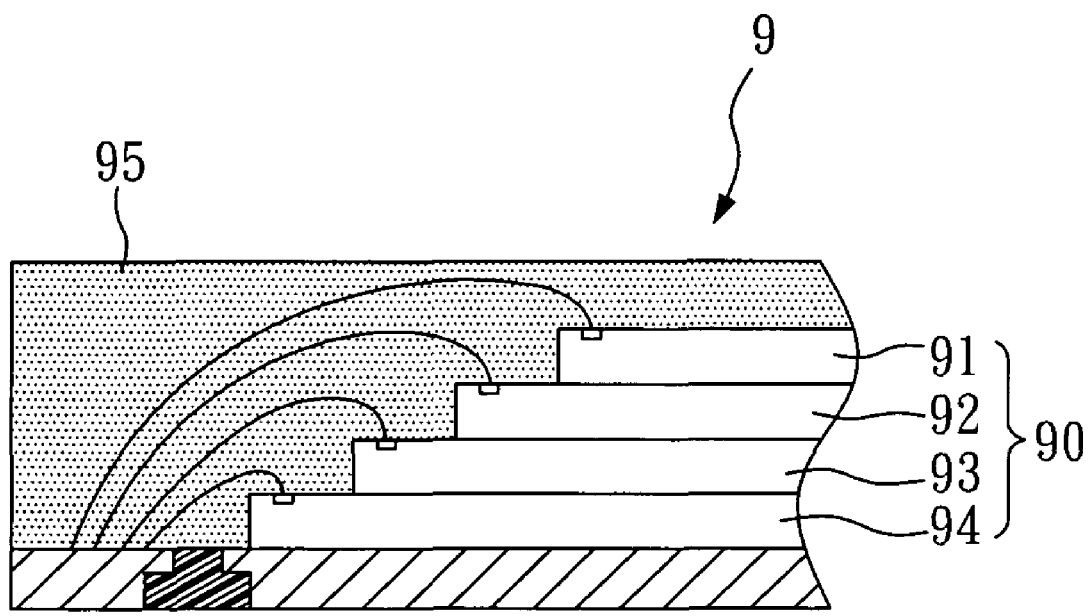
FIG. 1 is a cross-sectional view of a conventional memory IC chip set in a stacking manner.
Figure 2:
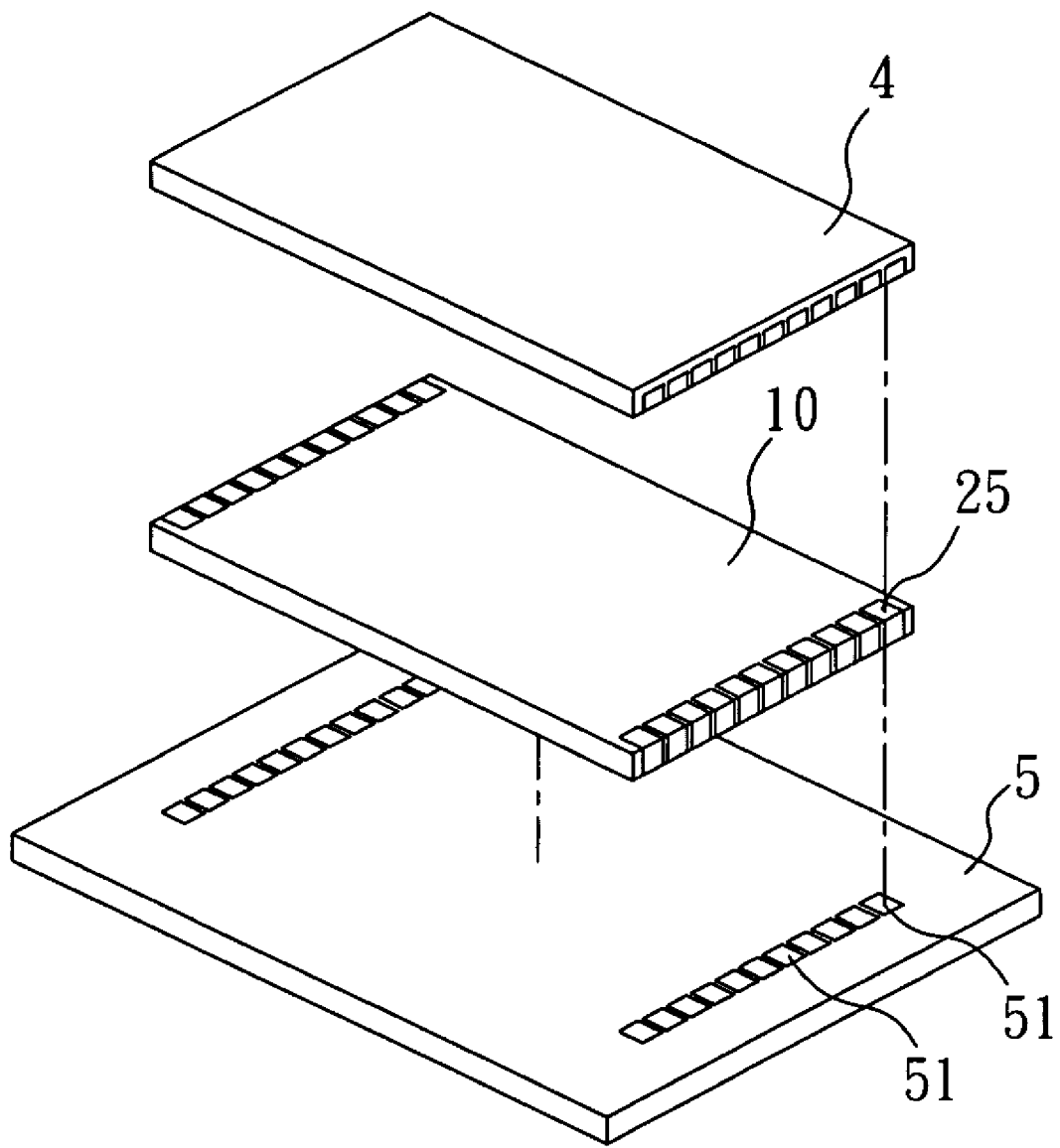
FIG. 2 is a perspective view of a first preferred embodiment of the invention.
Figure 3:
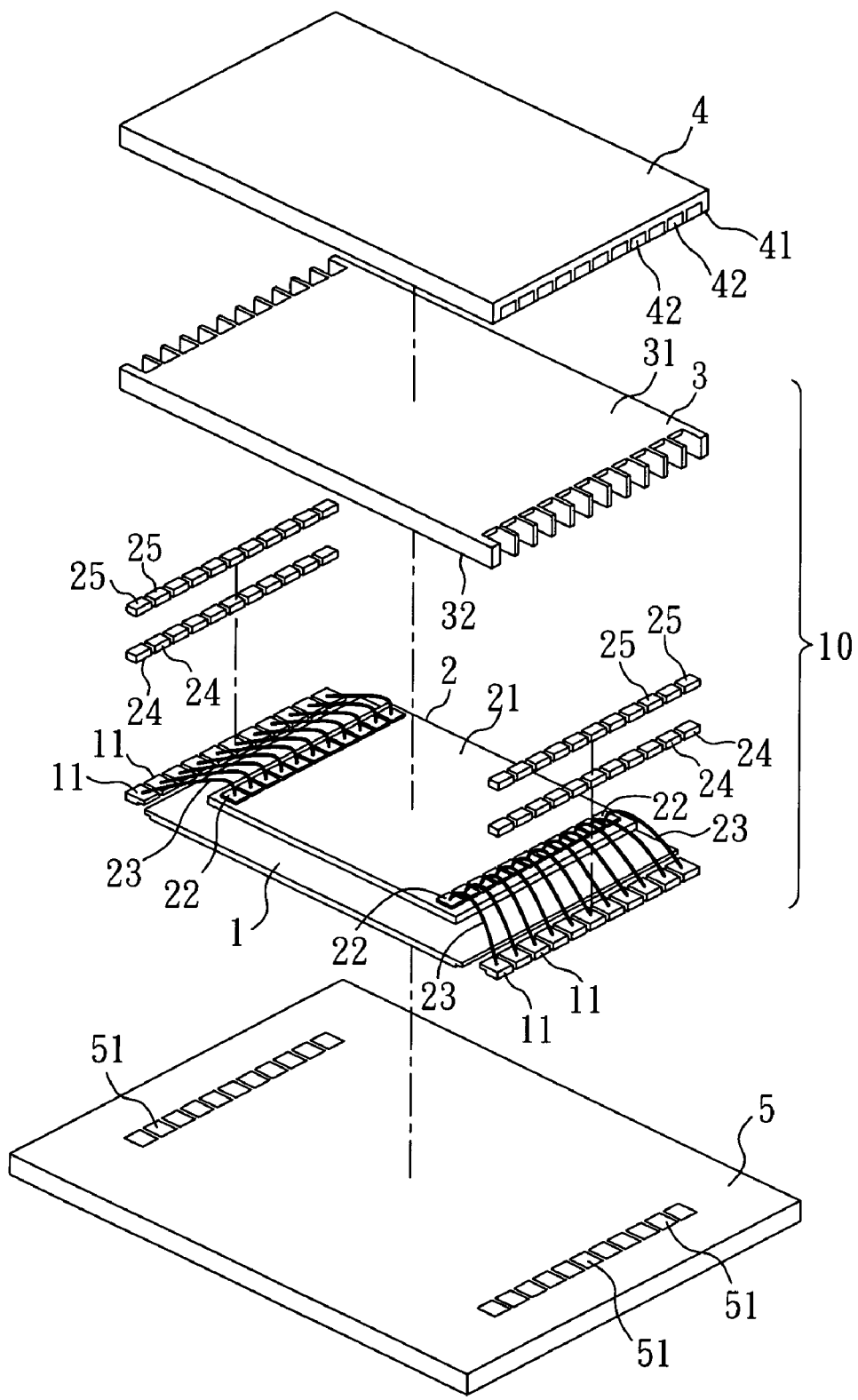
FIG. 3 is an exploded view of the first preferred embodiment of the invention.

Please refer to FIGS. 2 and 3. FIG. 2 is a perspective view of a first preferred embodiment of the invention. FIG. 3 is an exploded view of the first preferred embodiment of the invention. According to the preferred embodiment, a package module for a memory IC chip 10 comprises a ground pad 1, a plurality of lower contact pads 11, at least a first memory IC chip 2, a plurality of lead frames 24, a plurality of upper contact pads 25, and a molding layer 3.

As shown in FIG. 3, the plurality of lower contact pads 11 are distributively provided on the periphery of the ground pad 1 without electrically contacting one another. The at least a first memory IC chip 2 is stacked on an upper side of the ground pad 1, an upper surface 21 of the at least a first memory IC chip 2 is provided with a plurality of first solder pads 22, and each of the plurality of first solder pads 22 is electrically connected to one of the plurality of lower contact pads 11 via one of a plurality of golden lines 23. Each of the plurality of lead frames 24 is correspondingly soldered to one of the plurality of lower contact pads 11 and each of the plurality of upper contact pads 25 is correspondingly soldered to one of the plurality of lead frames 24.

The molding layer 3 is to package and enclose the ground pad 1, the plurality of lower contact pads 11, the at least a first memory IC chip 2, the plurality of lead frames 24 and the plurality of upper contact pads 25, and to cure the same, wherein a lower surface 32 of the molding layer 3 further exposes the plurality of lower contact pads 11 and an upper surface 31 of the molding layer 3 further exposes the plurality of upper contact pads 25.

Since the upper contact pads 25 are exposed to the upper surface 31 of the molding layer 3 and the lower contact pads 11 of the ground pad 1 are exposed to the lower surface 32 of the molding layer 3, such an arrangement will facilitate soldering the package module for a memory IC chip 10 upward to an upper layer of a package structure 20, or downward to a lower layer of a package structure 30, thereby accomplishing the object of expanding the memory capacity, while maintaining a high acceptable production yield.

According to the invention, since the upper contact pads 25 are exposed to the upper surface 31 of the molding layer 3 and the lower contact pads 11 are exposed to the lower surface 32 of the molding layer 3, it will facilitate that each of a plurality of upper contact pads 25 of the lower layer of the package structure 30 is correspondingly soldered to one of the plurality of lower contact pads 11 of the upper layer of the package structure 20 as the package structures 20 and 30 are stacked together. Thus, it is capable of obtaining a high acceptable production yield for each of the individual package module, while accomplishing the object of expanding the memory capacity as a whole when stacking the package structures.

Figure 4:
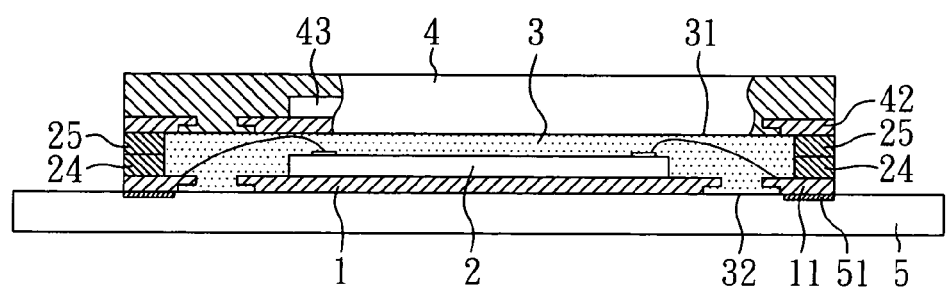
FIG. 4 is a cross-sectional view of the first preferred embodiment of the invention.

Please refer to FIG. 3 together with FIG. 4. FIG. 4 is a cross-sectional view of the first preferred embodiment of the invention. As shown, a covered package IC 4 covers an upper side of the molding layer 3, wherein a lower surface 41 of the covered package IC 4 is provided with a plurality of second solder pads 42, each being correspondingly soldered to one of the plurality of upper contact pads 25. The covered package IC 4 comprises inside a covered package memory IC 43. The covered package IC 4 is selected from an IC set constituted by a dual flat no-lead (DFN) package IC and a quad flat no-lead (QFN) package IC.

The package module for a memory IC chip 10 and the covered package IC 4 are configured and installed on a circuit board 5, an upper surface of the circuit board 5 is provided with a plurality of metal contacts 51, and each of the plurality of lower contact pads 11 exposed on the lower surface 32 of the molding layer 3 is correspondingly soldered to one of the plurality of metal contacts 51 on the circuit board 5.

Figure 5:
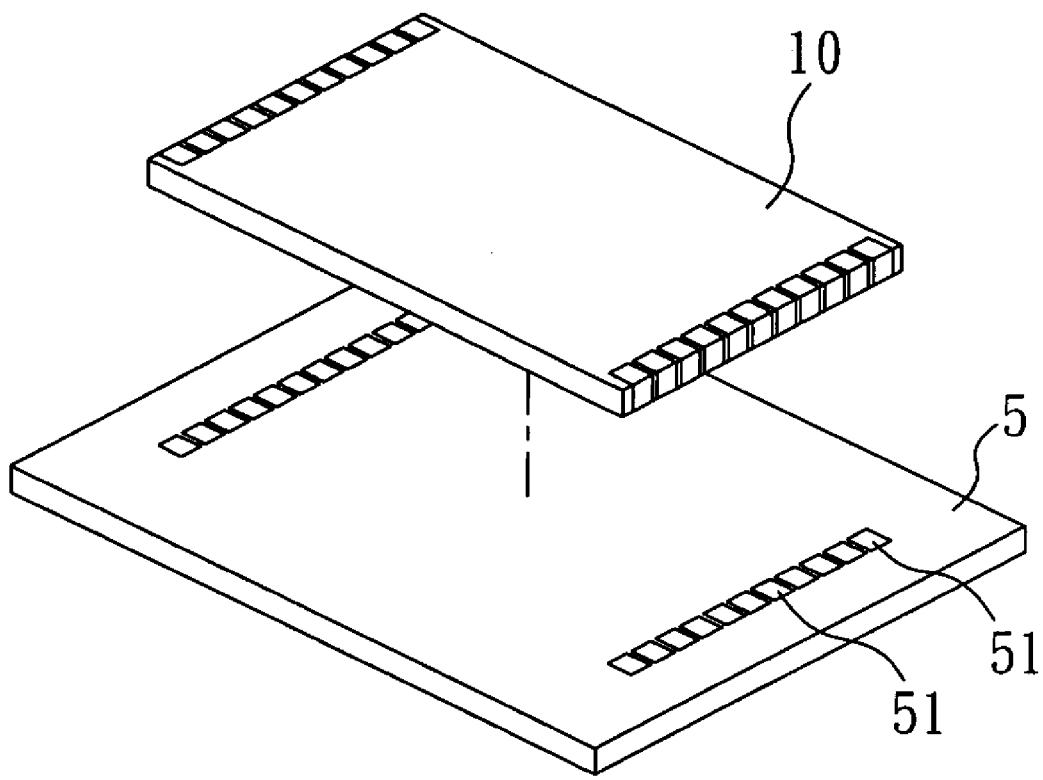
FIG. 5 is a perspective view of a second preferred embodiment of the invention.

Please refer to FIG. 5, which is a perspective view of a second preferred embodiment of the invention. As shown in the drawing, it is substantially the sane as the first preferred embodiment, with the difference that there is no covered package IC 4 to cover thereon. In the practical application, if the customer's requirement for the specification of the memory capacity may be meet, it can proceed with the storing operation of the memory simply by a package module for a single memory IC chip 10.

Figure 6:
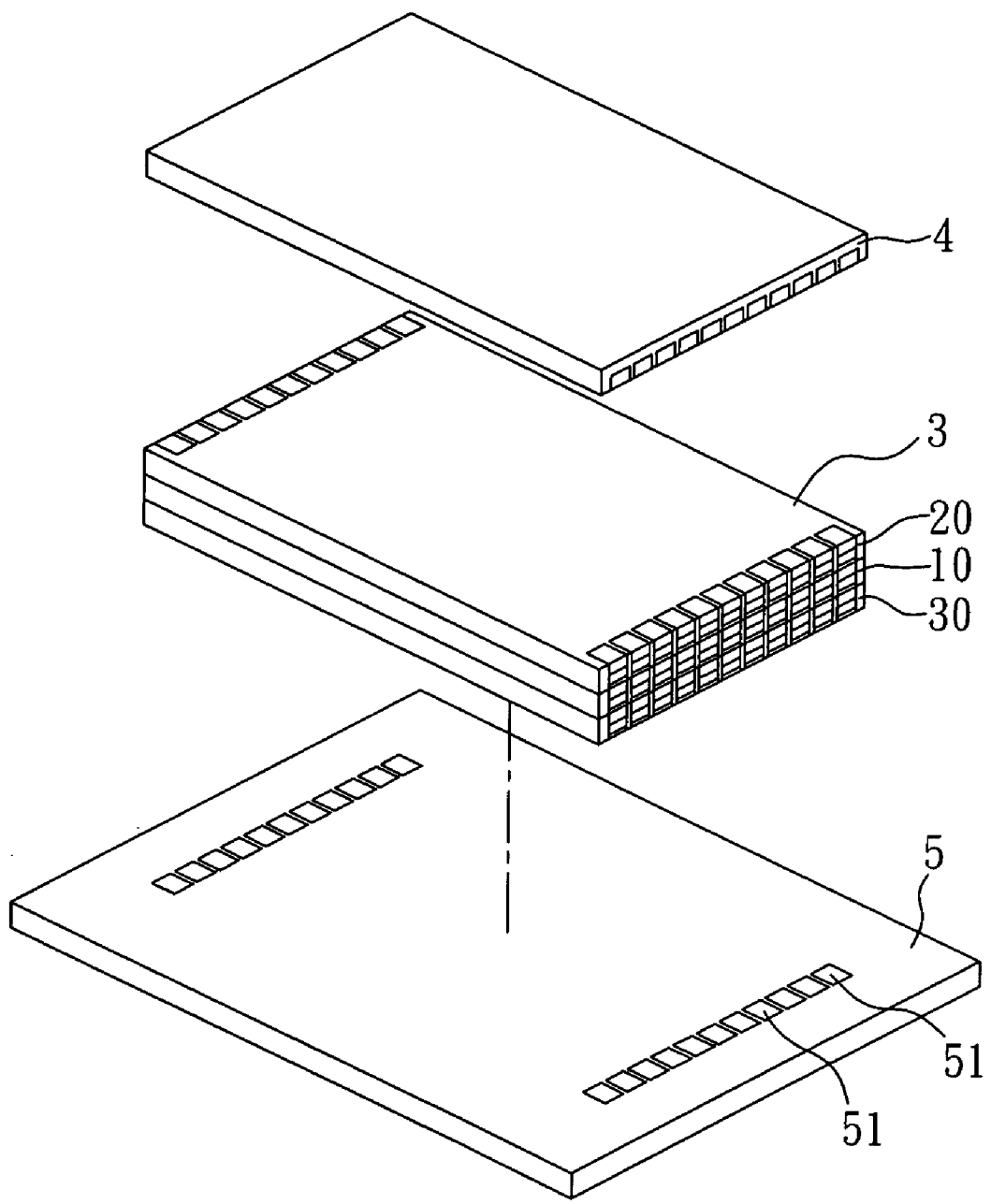
FIG. 6 is a perspective view of a third preferred embodiment of the invention.
Figure 7:
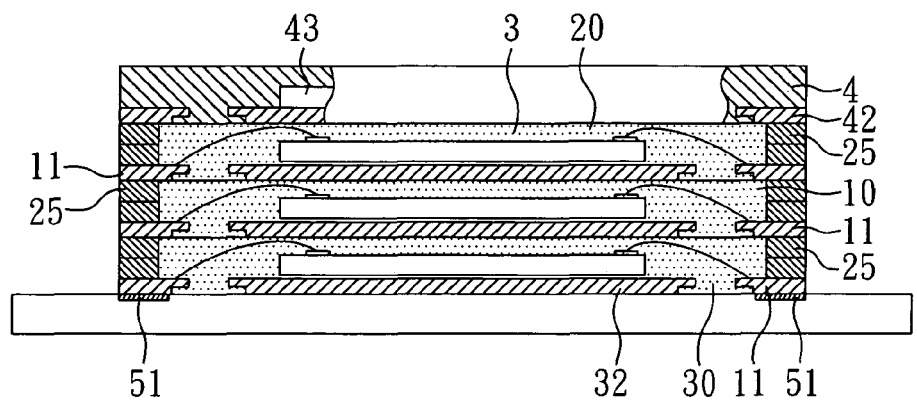
FIG. 7 is a cross-sectional view of the third preferred embodiment of the invention.

Please refer to FIGS. 6 and 7. FIG. 6 is a perspective view of a third preferred embodiment of the invention and FIG. 7 is a cross-sectional view of the third preferred embodiment of the invention. As shown therein, the preferred embodiment provides a package module for a memory IC chip, comprising at least two layers of package structure 20, 30 that are stacked together, wherein each of the at least two layers of package structure 20, 30 is the same in internal structure as the package module for a memory IC chip 10 of the first preferred embodiment. The third embodiment merely differs from the first embodiment in assembling in module the package module for a memory IC chip 10 according to the different specifications of the memory capacity instructed by the customer.

In which, the package module for a memory IC chip 10 refers to a package structure, and the package structure 20 on the upper layer refers to another package module for a memory IC chip on the upper side relative to the package module for a memory IC chip 10, wherein each of the plurality of lower contact pads 11 of the package structure 20 on the upper layer is correspondingly soldered to one of the plurality of upper contact pads 25 of the package structure 10 on the lower layer.

The package structure 30 on the lower layer refers to another package module for a memory IC chip on the lower side relative to the package module for a memory IC chip 10, wherein each of the plurality of upper contact pads 25 of the package structure 30 on the lower layer is correspondingly soldered to one of the plurality of lower contact pads 11 of the package structure 10 on the upper layer, thereby accomplishing the objective of expanding the memory capacity of the package module for a memory IC chip 10.

As shown in FIGS. 6 and 7, the package module for a memory IC chip according to the preferred embodiment further provides a covered package IC 4, covering an upper side of the molding layer 3 of the package structure 20 on the uppermost layer, wherein a lower surface 41 of the covered package IC 4 is provided with a plurality of second solder pads 42, each being correspondingly soldered to one of the plurality of upper contact pads 25 of the package structure 20 on the upper layer.

The covered package IC 4 comprises inside a covered package memory IC 43. The covered package IC 4 is selected from a no-lead IC set constituted by a dual flat no-lead (DFN) package IC and a quad flat no-lead (QFN) package IC.

Further, the package module for a memory IC chip 10 and the covered package IC 4 are configured and installed on a circuit board 5, an upper surface of the circuit board 5 is provided with a plurality of metal contacts 51, and each of the plurality of lower contact pads 11 exposed on the lower surface 32 of the molding layer 3 of the package structure 30 on the lowermost layer is correspondingly soldered to one of the plurality of metal contacts 51 on the circuit board 5.

Figure 8:
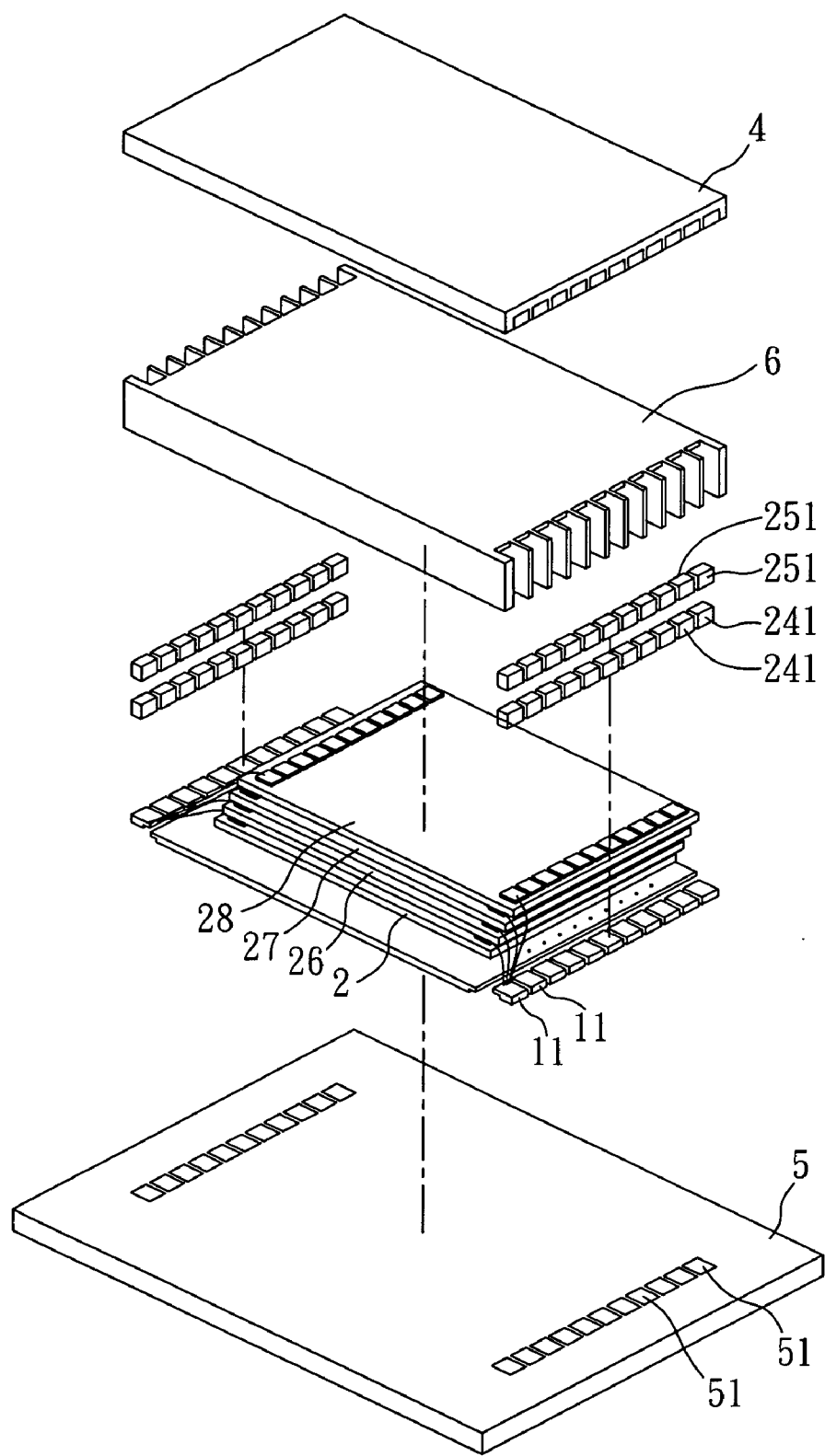
FIG. 8 is an exploded view of a fourth preferred embodiment of the invention.

Please refer to FIG. 8. FIG. 8 is an exploded view of a fourth preferred embodiment of the invention. As shown in FIG. 8, this embodiment is structurally the same as the first embodiment, while the difference merely lies in that in this embodiment, memory IC chips include the first memory IC chip 2, a second memory IC chip 26, a third memory IC chip 27 and a fourth memory IC chip 28. On the other hand, a plurality of lead frames 24 and a plurality of upper contact pads 251 are thicker than those of the first embodiment. Finally, the packaging is completed using a molding layer 6.

In the package module according to this preferred embodiment, it is preferable to adopt 3- or 4-layered memory IC chips according to present process ability, while maintaining expected good yield. However, the more the layers of the memory IC chips, the poor the yield. Or, if fewer the layers of the memory IC chips are adopted, it will not meet the cost.

Although the present invention has been explained in relation to its preferred embodiment, it is to understood that many other possible modifications and variations can be made without departing from the scope of the invention as hereinafter claimed.

What is claimed is:

1. A package module for a memory IC chip, comprising:
   a ground pad;
   a plurality of lower contact pads, distributively provided on the periphery of the ground pad without electrically contacting one another;
   at least a first memory IC chip, stacked on an upper side of the ground pad, an upper surface of the at least a first memory IC chip being provided with a plurality of first solder pads, each of the plurality of first solder pads being electrically connected to one of the plurality of lower contact pads via one of a plurality of golden lines;
   a plurality of lead frames, each being correspondingly soldered to one of the plurality of lower contact pads;
   a plurality of upper contact pads, each being correspondingly soldered to one of the plurality of lead frames; and
   a molding layer, for packaging and enclosing the ground pad, the plurality of lower contact pads, the at least a first memory IC chip, the plurality of lead frames and the plurality of upper contact pads, and curing the same, wherein a lower surface of the molding layer further exposes the plurality of lower contact pads and an upper surface of the molding layer further exposes the plurality of upper contact pads.

2. A package module for a memory IC chip as claimed in claim 1, further comprising a covered package IC for covering an upper side of the molding layer, wherein a lower surface of the covered package IC is provided with a plurality of second solder pads, each being correspondingly soldered to one of the plurality of upper contact pads.

3. A package module for a memory IC chip as claimed in claim 2, wherein the covered package IC comprises inside at least a package memory IC chip.

4. A package module for a memory IC chip as claimed in claim 2, wherein the covered package IC is selected from a no-lead package IC set constituted by a dual flat no-lead package IC and a quad flat no-lead package IC.

5. A package module for a memory IC chip as claimed in claim 1, wherein the package module for a memory IC chip is configured and installed on a circuit board, an upper surface of the circuit board is provided with a plurality of metal contacts, and each of the plurality of lower contact pads exposed on the lower surface of the molding layer is correspondingly soldered to one of the plurality of metal contacts.

6. A package module for a memory IC chip, comprising a package structure having at least two layers that are stacked together, wherein the package structure of each layer includes:
   a ground pad;
   a plurality of lower contact pads, distributively provided on the periphery of the ground pad without electrically contacting one another;
   at least a first memory IC chip, stacked on an upper side of the ground pad, an upper surface of the at least a first memory IC chip being provided with a plurality of first solder pads, each of the plurality of first solder pads being electrically connected to one of the plurality of lower contact pads via one of a plurality of golden lines;
   a plurality of lead frames, each being correspondingly soldered to one of the plurality of lower contact pads;
   a plurality of upper contact pads, each being correspondingly soldered to one of the plurality of lead frames; and
   a molding layer, for packaging and enclosing the ground pad, the plurality of lower contact pads, the at least a first memory IC chip, the plurality of lead frames and the plurality of upper contact pads, and curing the same, in which a lower surface of the molding layer further exposes the plurality of lower contact pads and an upper surface of the molding layer further exposes the plurality of upper contact pads,
   wherein each of the plurality of upper contact pads of a lower layer of a package structure is correspondingly soldered to one of the plurality of lower contact pads of an upper layer of a package structure.

7. A package module for a memory IC chip as claimed in claim 6, further comprising a covered package IC for covering an upper side of the molding layer located on the uppermost layer of the package structure, wherein a lower surface of the covered package IC is provided with a plurality of second solder pads, each being correspondingly soldered to one of the plurality of upper contact pads located on the uppermost layer of the package structure.

8. A package module for a memory IC chip as claimed in claim 7, wherein the covered package IC comprises inside at least a package memory IC chip.

9. A package module for a memory IC chip as claimed in claim 7, wherein the covered package IC is a no-lead package IC set constituted by a dual flat no-lead package IC and a quad flat no-lead package IC.

10. A package module for a memory IC chip as claimed in claim 6, wherein the package module for a memory IC chip is configured and installed on a circuit board, an upper surface of the circuit board is provided with a plurality of metal contacts, and each of the plurality of lower contact pads exposed on the lower surface of the molding layer located on the lowermost layer of the package structure is correspondingly soldered to one of the plurality of metal contacts on the circuit board.

* * * * *